United States Patent [19]

McKaveney

[11] 4,447,492

[45] * May 8, 1984

[54] ARTICLES HAVING AN ELECTRICALLY CONDUCTIVE SURFACE

[75] Inventor: James P. McKaveney, Claremont, Calif.

[73] Assignee: Occidental Chemical Corporation, Niagara Falls, N.Y.

[ * ] Notice: The portion of the term of this patent subsequent to Apr. 8, 1997 has been disclaimed.

[21] Appl. No.: 290,909

[22] Filed: Aug. 7, 1981

Related U.S. Application Data

[63] Continuation-in-part of Ser. No. 42,374, May 24, 1979, abandoned, which is a continuation of Ser. No. 853,653, Nov. 21, 1977, abandoned.

[51] Int. Cl.³ .................... B32B 5/16; B32B 15/08; B32B 27/14
[52] U.S. Cl. .................... 428/328; 252/500; 252/516; 252/519; 252/520; 427/58; 427/82; 427/126.2; 428/331; 428/427; 428/433; 428/458; 428/464; 428/697; 428/698; 428/900
[58] Field of Search ............... 428/332, 323, 433, 464, 428/328, 427, 432, 539, 458, 460, 461, 465, 697, 698, 900, 331; 252/504, 519, 516, 520, 500; 427/58, 82, 126.2

[56] References Cited

U.S. PATENT DOCUMENTS

| | | | |
|---|---|---|---|
| 4,057,777 | 11/1977 | Merz et al. | 252/519 |
| 4,149,910 | 4/1979 | Popplewell | 148/6.35 |
| 4,168,344 | 9/1979 | Shapiro et al. | 428/427 |
| 4,197,218 | 4/1980 | McKaveney | 252/504 X |

*Primary Examiner*—Thomas J. Herbert, Jr.
*Attorney, Agent, or Firm*—James F. Tao; William G. Gosz

[57] ABSTRACT

Electrically conductive articles which comprise a nonconductive substrate having thereon a substantially uniform, electrically conductive dispersion of finely divided particles of ferroalloys, silicon alloys, or mixtures thereof, are described. The articles are useful as components of electrical switches, contacts, connectors, circuit boards or electromagnetic interference shields. The conductive portion of the article may be subsequently electroplated or electrostatically painted.

22 Claims, No Drawings

ARTICLES HAVING AN ELECTRICALLY CONDUCTIVE SURFACE

CROSS-REFERENCE TO RELATED APPLICATIONS

This application is a continuation-in-part of Ser. No. 042,374 filed May 24, 1979, now abandoned, which is a continuation of Ser. No. 853,653, filed Nov. 21, 1977, now abandoned.

BACKGROUND OF THE INVENTION

The present invention relates to articles having electrically non-conductive substrates with an electrically conductive surface. The non-conductive substrate may be organic, for example, plastic or resin, or inorganic, for example, ceramic, glass, plasters such as plaster of paris or the like, or it may be comprised of mixtures of non-conductive organic and inorganic materials. The present invention provides articles having an electrically conductive surface useful in electromagnetic interference shielding and as components of electrical contacts, connectors, switches, electronic tubes, and printed circuit boards. The articles of the present invention are also eminently adapted to be subsequently utilized in electrostatic painting or electroplating processes.

Most materials may be classified according to their ability to conduct or impede the flow of electrical current. Metals are generally extremely good electrical conductors, while plastic materials are generally very good insulators. Electrical conductivity may be categorized to define good conductors as those having a resistivity between $10^{-6}$ and $10^0$ ohm-centimeter; semi-conductors between $10^0$ and $10^8$ ohm-centimeter; and good insulators (poor conductors) between $10^8$ and $10^{12}$ ohm-centimeter.

Although the present invention is directed more to articles which have surfaces that are good conductors, it will be understood that the present invention also includes articles which have semi-conductive surfaces, and the term "electrically conductive", as used herein, shall include both good conductors and semi-conductors.

The desirability of producing electrically conductive articles having a conductive surface on a non-conducting substrate has long been recognized. Such articles have a multiplicity of uses in electrical apparatus and parts; can be selectively electroplated and/or electrostatically painted at approximately the conductive surface for asthetic or mechanical purposes; and can provide selective conductivity for shielding electromagnetic interference emanating from other sources. Electrically conductive articles frequently include a coating which is comprised of a dispersion of noble metal powders, e.g., platinum, gold, or silver. The resistivity of such surfaces are usually in the order of about 0.1 ohm-centimeter or less. Although expensive, noble metals are employed to a great extent because non-noble metal powders, such as copper, nickel, or aluminum, form high resistance surface oxides. Even with meticulous cleaning and preparation to remove the non-noble metal oxides, the oxides reform and, over a period of time, electrical conductivity decreases.

The electrical conductivity of an article having a surface coating comprised of a dispersion of electrically conductive particles depends upon the particle-to-particle contact. To be a good conductor, electric current must flow from particle to particle with the lowest amount of contact resistance possible. In the case of non-noble metal powders, the oxide coating that forms, while perhaps only a few atoms thick, has a high resistivity and prevents the ready flow of current between contiguous particles.

The expense of noble metals and the disadvantages of using non-noble metal powders have caused a number of alternate solutions to be suggested, for example, the use of coatings containing various mixtures of noble and non-noble metal powders, the use of non-noble metal powders with a noble metal coating, and the utilization of processes for cleaning and maintaining the powder in a free metal form to the point of incorporation into a binder material. However, none of these has proven satisfactory from either the initial cost, preparation expense or performance viewpoints.

The present invention utilizes an electrically conductive material which not only has an economic advantage over noble metals, but also over non-noble metals commonly used, while providing a conductivity comparable to that of powdered copper. The present conductive materials also have brittle properties enabling them to be pulverized, or processed to powder form, easier than the metals presently in use in particulate form. The electrical conductivity of the articles of the present invention are comparable to those of the non-noble metals but are much less prone to the subsequent formation of oxide coatings that increase electrical resistance.

GENERAL DESCRIPTION OF THE INVENTION

The present invention relates to electrically conductive articles which comprise a non-conductive substrate having a substantially uniform, electrically conductive dispersion of finely divided particles of ferroalloys, silicon alloys, or mixtures thereof distributed on the surface of the substrate.

The non-conductive substrate may suitably be a plastic or resin material. The terms "plastic" or "resin", as used herein, embrace any one of a large and varied group of materials commonly referred to as "plastics" and "resins", characterized by the fact that they are organic substances of relatively high molecular weight that are good electrical insulators.

Plastics that may be employed in the present invention may be chosen from thermosetting materials, such as phenolic and ureaformaldehyde resins, epoxy resins; thermoplastic materials, such as polystyrene, polyethylene, polymethylmethacrylate, vinyl polymers and copolymers, cellulose acetate, silicone, polymonochlorotrifluoroethylene, polytetrafluoroethylene, and the like. The plastic or resin material may also contain filler materials, such as those commonly used in the art, for example, lubricants, plasticizers, dyes, pigments, organic and inorganic fillers.

The non-conductive substrate may be selected from ceramic materials, for example, alumina, clays, fireclays, or concrete. The non-conductive substrate may also be wood or glass.

The electrically conductive dispersion of the present invention may be distributed on the surface of the substrate by the application of a coating comprised of a filler which is substantially comprised of electrically conductive materials of the present invention and a binder.

The electrically conductive materials of the present invention are selected from ferroalloys, silicon alloys, or mixtures thereof.

Suitable ferroalloys for use in the filler are those known as refractory ferroalloys. Such alloys include ferromanganese silicon, ferromanganese, ferromolybdenum, ferrosilicon, ferrochrome, ferrovanadium, ferrozirconium, ferrotitanium, ferrotungsten, ferroboron, ferrophosphorus, iron carbon, and mixtures thereof. Particularly preferred ferroalloys are ferrophosphorus and ferroboron.

Suitable silicon alloys or silicides for use in the filler include steel-making alloys prepared by the ferroalloy industry and known in the trade as calsibar (CaSiBa), magnesium ferrosilicon (MgFeSi), hypercal (AlBaCaFeSi), siliconmanganese (MnFeSi), magnesium silicide ($Mg_2Si$) and various other manganese titanium, chromium, nickel and cobalt silicides.

The alloys and silicides employed in the compositions of the present invention are conveniently prepared by any suitable method known to the art, as, for example, by carbon reduction of the active metal oxide such as lime (CaO) or manganese ore ($MnO_2$) with silica ($SiO_2$) in the submerged-arc electric furnace typical of the ferroalloy industry.

The conductive metal particles, alloys, and/or silicides essentially constitute the filler component and are dispersed on the non-conductive substrate in a finely divided form. Desirably, the conductive metal particles, alloys, and/or silicides have an average size within the range of from about 2 to about 10 microns, preferably, within the range of from about 5 to about 7 microns. The alloys and/or silicides may be conveniently comminuted by any suitable crushing or grinding operation preferably in a carbon dioxide atmosphere to minimize any dust explosion hazard from the active alloy surface. Methods of preparation for the conductive metal particles are extensive and well known to those of skill in the art.

It has frequently been found that improved results, in terms of enhancement of the electrical conductivity of the inert alloys, may be obtained by cleaning the alloys after the crushing and/or grinding operation. Cleaning is desirably effected by washing the ground material with an aqueous acidic solution, preferably an aqueous solution of hydrochloric acid. Typically, the hydrochloric acid solution used as a concentration within the range of about 1 to about 12 percent, and the ground material is washed with this solution for a period sufficient to form a clean surface on the refractory ferroalloy. In general, washing times of from about 1 to about 4 hours are typical.

The amount of conductive material utilized in the filler may be varied through a considerable range without departing from the spirit of the present invention and will be dependent upon the desired electrical characteristics and use of the finished article. The conductivity of the article is increased as the amount of conductive material is increased. Factors limiting the amounts of conductive materials included in the present compositions are that they be sufficient for electrical conductivity and less than an amount that will adversely affect the holding or carrying ability of the binder. Generally, the amount of conductive material in the filler varies between about 20 and about 95 percent by weight of the total weight of the binder and filler; suitably, a range between about 30 and about 80 percent by weight, and, preferably, within this range, amounts between about 40 and about 80 percent by weight are eminently useful.

Mixtures of the present conductive materials and other conductive materials, metal powders, may be utilized. However, the economic advantage and performance characteristics are to be considered. Generally, mixtures containing less than about 30 percent by weight of the conductive materials of the present invention are not advantageously employed. In electromagnetic shielding, where both conductivity and magnetic qualities are desired in the coating, it has been found appropriate to mix other conductive materials, having superior magnetic qualities, with the filler.

Binders that are useful to obtain the electrically conductive dispersions of the present invention are those generally used in coating compositions and well known in the prior art. The choice of binder generally is not critical to the present invention. Various binder materials, both organic and inorganic, may be used; the choice of a particular binder is dependent upon the use and electrical characteristics which are desired in each particular instance. Thus, for example, the binder used may include various synthetic resins, such as epoxies, polyamids, polystyrene, polyvinyl butyral resins, polyvinyl acetate resins, silicones, and the like. Additionally, inorganic binders may also be used, including those obtained from silicates, such as the alkali metal silicates such as sodium silicates, phosphates, hydrolyzed ethyl silicates, butyltitanates, and the like. It is believed that the use of these and other similar binder materials will be apparent to those skilled in the art and that the particular binder which is suitable in each instance may easily be selected.

The filler and binder mixture may be applied to the substrate using any suitable technique, for example, by spraying, brushing, immersion, flowing, gelcoating, or the like. Typically, the binder-filler mixtures are applied so as to produce a dispersion of the conductive material in a film having a thickness within the range of about 0.4 to about 5.0 mils, although thicknesses which are outside of these typical ranges, up to about 15 mils, may also be used, depending upon the particular conditions of application and intended use of the article. Desirably, the dispersion is made up of a binder in the amount of about 3 to about 80 percent by weight, and preferably about 7 to about 70 percent by weight, and the filler in an amount of about 20 to about 97 percent by weight, and preferably, about 30 to about 93 percent by weight. Following the application of the dispersion to the nonconducting substrate, drying and/or curing of the dispersion is effected. The type and extent of the drying or curing will vary in each instance, depending upon the specific nature of the binder material which is used in the composition. Thus, in some instances, heating may be utilized to effect drying or cure of the dispersions while in other instances, simple air drying or curing may be sufficient.

DETAILED DESCRIPTION OF THE INVENTION

The electrically conductive articles of the present invention comprise a non-conductive substrate having an electrically conductive dispersion of a finely divided ferroalloy, silicon alloy, or mixtures thereof deposited on a surface of the article. The conductive dispersion may preferably be obtained by applying to the non-conductive surface a coating composition, film, or gelcoating comprised of a binder and a filler. The filler is essentially comprised of the electrically conductive material of the present invention.

The coating composition utilized to form the electrically conductive dispersion may be formulated by admixing the binder and the filler using any suitable mixing techniques.

The electrical conductivity of the articles of the present invention is dependent upon the thickness of the dispersion and the amount and particle size of conductive material in the dispersion. The dispersions of the present invention contemplate thicknessess between about 0.4 and about 15 mils, and, preferably, from about 2 to about 5 mils. The dispersion or film contains a sufficient amount of conductive material to be electrically conductive. Generally, amounts between about 20 and about 97 percent by weight of the filler and binder are useful, and, within this range, from about 30 to about 80 percent by weight are normally found useful. To facilitate a substantially uniform dispersion, the particle size of the conductive material preferably ranges between about 2 and about 10 microns, and, most preferably, between about 5 and about 7 microns. Within the foregoing criteria, the surface resistivity of articles will range between about $1 \times 10^{-2}$ to about $1 \times 10^{-5}$ ohm-centimeter.

The conductive articles of the present invention are useful as components of electrical switches, contacts, and connectors. The articles are useful as bases for so-called printed circuitry boards or for shielding from electromagnetic interference. For example, the nonconductive substrate may be partially masked or otherwise protected, and the electrically conductive dispersion deposited, by spraying, painting, or formed in a gelcoat, on the exposed portion.

The following specific examples are given as exemplary of the manner the present invention may be practical and are not to be taken as a limitation thereof. References to parts are parts by weight and percent is percent by weight throughout the examples.

EXAMPLE I

A conductive dispersion of ferrophosphorus was deposited on a glass substrate utilizing an epoxy polyamid resin binder. 325.7 parts ferrophosphorus having a particle size ranging from about 2 to about 10 microns were mixed with 82.5 parts of an epoxy polyamid resin mixture containing about 1 percent of a suspending agent and reduced with about 56 percent of xylene and cellosolve. The mixture was sprayed on a series of 3"×6" glass plates to obtain films of varying thicknesses. After air drying, the plates were oven-baked for 30 minutes at 150° C. The film thicknesses were measured with a micrometer. Electrical conductivity was measured by means of an ohmmeter utilizing probes about 1/16" diameter pressed against the film at points 6" apart. Electrical conductivity of various thicknesses of the dispersion or film are shown in the following table:

| Thickness in mils | Resistivity in ohms/linear inch |
| --- | --- |
| 1.5–2.5 | $5.2 \times 10^7$ |
| 3.5–4.5 | $1.7 \times 10^3$ |
| 5.5–6.5 | 0.027 |
| 6.5–8.5 | 0.15 |

EXAMPLE II

The procedure of Example I was repeated using 325.7 parts of ferrophosphorus as the filler and 96.1 parts of the epoxy polyamid resin as the binder. The conductivity of various thicknesses of the dispersions are shown in the following table:

| Thickness in mils | Resistivity in ohms/linear inch |
| --- | --- |
| 1.5–2.5 | $6 \times 10^9$ |
| 2.5–3.5 | $2.6 \times 10^7$ |
| 5.5–6.5 | $4.0 \times 10^4$ |
| 8.5–10.5 | 0.17 |

EXAMPLE III→VII

A conductive dispersion of ferrophosphorus was deposited on a fiberglass reinforced polyester substrate utilizing an epoxy polyamid resin binder. The ferrophos had a particle size ranging from about 2 to about 10 microns and was mixed with an epoxy polyamide resin containing about 1 percent of a suspending agent and reduced with from about 56 percent of xylene and cellasolve, in varying ratios from about 6:1 to about 9:1 parts by weight ferrophosphorous to resin.

The varying mixtures were sprayed on a series of 4"×4" fiberglass reinforced polyester panels and air dried to varying thicknesses. Electrical conductivity was measured by the means of example II. Effectiveness of the electromagnetic interference shielding qualities of the film was evaluated by measuring the attenuation in strength of an electromagnetic field produced by emissions from electronic equipment at frequencies of from about 0.5 to about 960 MHz. Attentuation is measured in decibels, with each 10 decibel representing an increment of attenuation signifying a tenfold improvement in shielding; that is 10 decibel attenuation means the energy reaching the detector is 10 percent of the original source energy while 20 decibels would be 1 percent of the source. The results are as tabulated below:

| Example | Ratio | Thickness (mils) | Resistance ohms/in | Decibels |
| --- | --- | --- | --- | --- |
| III | 9:1 | 8.0 | 17 | 30 |
| IV | 7.3:1 | 8.0 | 27 | 25 |
| V | 7.3:1 | 3.7 | 72 | 17 |
| VI | 6:1 | 7.5 | 47 | 24 |
| VII | 6:1 | 3.6 | 110 | 16 |

Although the present invention has been described with respect to several illustrative embodiments, it is not to be interpreted as so limited, as it will be evident to those of ordinary skill in the art that substitutions and equivalents are possible without departing from the spirit of the invention or the scope of the claims.

What is claimed is:

1. An electrically conductive article having a nonconductive substrate which substrate has at least a portion of the surface thereof coated with a composition comprising about 3 to about 80 percent by weight of a binder and about 20 to about 97 percent by weight of a filler, the filler comprising particles, having an average particle size of from about 2 to about 10 microns, of a refractory ferroalloy selected from the group consisting of ferromanganese silicon, ferromanganese, ferromolybdenum, ferrosilicon, ferrochrome, ferrovanadium, ferrozirconium, ferrotitanium, ferrotungsten, ferroboron, ferrophosphorus, iron carbide, and mixtures thereof.

2. The article of claim 1 wherein the ferroalloy is ferrophosphorus.

3. The article of claim 1 wherein the ferroalloy is ferroboron.

4. The article of claim 1 wherein the ferroalloy has an average particle size ranging between about 5 and about 7 microns.

5. The article of claim 1 wherein the non-conductive substrate is glass.

6. The article of claim 1 wherein the non-conductive substrate is a ceramic material.

7. The article of claim 1 wherein the non-conductive substrate is plaster.

8. The article of claim 1 wherein the non-conductive substrate is cellulosic material.

9. The article of claim 1, wherein the coating composition contains additional conductive material other than a ferroalloy having magnetic qualities.

10. The article of claim 1 wherein the non-conductive substrate is a plastic material.

11. The article of claim 10 wherein the ferroalloy is ferrophosphorus.

12. The article of claim 10 wherein the ferroalloy is ferroboron.

13. An electrically conductive article having a non-conductive substrate which substrate has at least a portion of the surface thereof coated with a composition comprising about 3 to about 80 percent by weight of a binder and about 20 to about 97 percent by weight of a filler, the filler comprising particles, having an average particle size of from about 2 to about 10 microns, of a material selected from the group consisting of silicon alloys, silicides, and mixtures thereof.

14. An electrically conductive article having a non-conductive substrate which substrate has at least a portion of the surface thereof coated with a composition comprising about 3 to about 80 percent by weight of a binder and about 20 to about 97 percent by weight of a filler, the filler comprising particles, having an average particle size of from about 2 to about 10 microns, of a material selected from the group consisting of calsibar, magnesium-ferrosilicon, hypercal, silico-manganese, magnesium silicide, manganese titanium silicide, chromium silicide, nickel silicide, cobalt silicide, and mixtures thereof.

15. An electrically conductive article having a non-conductive substrate which substrate has at least a portion of the surface thereof coated with a composition comprising about 3 to about 80 percent by weight of a synthetic resin binder and about 20 to about 97 percent by weight of a filler, the filler comprising particles, having an average particle size of from about 2 to about 10 microns, of a refractory ferroalloy selected from the group consisting of ferromanganese silicon, ferromanganese, ferromolybdenum, ferrosilicon, ferrochrome, ferrovanadium, ferrozirconium, ferrotitanium, ferrotungsten, ferroboron, ferrophosphorus, iron carbide, and mixtures thereof.

16. The article of claim 15 wherein the ferroalloy is ferrophosphorus.

17. The article of claim 15 wherein the ferroalloy is ferroboron.

18. The article of claim 15 wherein the ferroalloy has an average particle size of from about 5 to about 7 microns.

19. The article of claim 15 wherein the non-conductive substrate is a plastic material.

20. The article of claim 19 wherein coating composition has a thickness of from about 0.4 to about 15 mils.

21. A method of rendering a non-conductive substrate electromagnetic shielding comprising applying to at least a portion of the surface of said non-conductive substrate a composition comprising about 3 to about 80 percent by weight of a binder and about 20 to about 97 percent by weight of a filler, the filler comprising particles, having an average particle size of from about 2 to about 10 microns, of a refractory ferroalloy selected from the group consisting of ferromanganese silicon, ferromanganese, ferromolybdenum, ferrosilicon, ferrochrome, ferrovanadium, ferrozirconium, ferrotitanium, ferrotungsten, ferroboron, ferrophosphorus, iron carbide, and mixtures thereof.

22. The method of claim 21 wherein said composition additionally contains conductive material other than a ferroalloy having magnetic qualities.

* * * * *